United States Patent
Park et al.

(10) Patent No.: US 8,841,704 B2
(45) Date of Patent: Sep. 23, 2014

(54) NITRIDE BASED SEMICONDUCTOR DEVICE AND MANUFACTURING METHOD THEREOF

(75) Inventors: Young Hwan Park, Seoul (KR); Woo Chul Jeon, Suwon (KR); Ki Yeol Park, Suwon (KR); Seok Yoon Hong, Suwon (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 91 days.

(21) Appl. No.: 13/406,123

(22) Filed: Feb. 27, 2012

(65) Prior Publication Data

US 2013/0146983 A1     Jun. 13, 2013

(30) Foreign Application Priority Data

Dec. 12, 2011    (KR) ......................... 10-2011-0133192

(51) Int. Cl.
*H01L 29/66*     (2006.01)
(52) U.S. Cl.
USPC .................................. 257/194; 257/E29.246
(58) Field of Classification Search
USPC .............. 257/12, 368, 194, 76, 190, E21.407, 257/E29.246
See application file for complete search history.

(56) References Cited

U.S. PATENT DOCUMENTS

| | | | |
|---|---|---|---|
| 8,373,200 B2 | 2/2013 | Jeon et al. | |
| 8,373,245 B2 | 2/2013 | Jeon et al. | |
| 8,384,130 B2 | 2/2013 | Jeon et al. | |
| 8,501,557 B2 | 8/2013 | Jeon et al. | |
| 8,525,227 B2 | 9/2013 | Jeon et al. | |
| 8,525,231 B2 | 9/2013 | Park et al. | |
| 2005/0145851 A1 * | 7/2005 | Johnson et al. | 257/76 |
| 2008/0153215 A1 * | 6/2008 | Sandhu et al. | 438/172 |
| 2011/0147798 A1 | 6/2011 | Radosavljevic et al. | |
| 2011/0233613 A1 * | 9/2011 | Jeon et al. | 257/194 |
| 2011/0254012 A1 * | 10/2011 | Vashchenko | 257/76 |
| 2012/0007049 A1 | 1/2012 | Jeon et al. | |
| 2012/0007053 A1 | 1/2012 | Jeon et al. | |
| 2012/0267637 A1 | 10/2012 | Jeon et al. | |
| 2012/0267639 A1 | 10/2012 | Jeon et al. | |
| 2012/0267642 A1 | 10/2012 | Jeon et al. | |
| 2012/0267687 A1 | 10/2012 | Jeon et al. | |

FOREIGN PATENT DOCUMENTS

| | | |
|---|---|---|
| KR | 20070092482 A | 9/2007 |
| KR | 1020070092482 A | 9/2007 |

* cited by examiner

*Primary Examiner* — Bilkis Jahan
(74) *Attorney, Agent, or Firm* — Blakely Sokoloff Taylor & Zafman LLP

(57) ABSTRACT

Disclosed herein is a nitride based semiconductor device, including: a substrate; a nitride based semiconductor layer having a lower nitride based semiconductor layer and an upper nitride based semiconductor layer on the substrate; an isolation area including an interface between the lower nitride based semiconductor layer and the upper nitride based semiconductor layer; and drain electrodes, source electrode, and gate electrodes formed on the upper nitride based semiconductor layer. According to preferred embodiments of the present invention, in the nitride based semiconductor device, by using the isolation area including the interface between the lower nitride based semiconductor layer and the upper nitride based semiconductor layer, problems of parasitic capacitance and leakage current are solved, and as a result, a switching speed can be improved through a gate pad.

5 Claims, 3 Drawing Sheets

NITRIDE BASED SEMICONDUCTOR DEVICE AND MANUFACTURING METHOD THEREOF

CROSS REFERENCE TO RELATED APPLICATION

This application claims the benefit of Korean Patent Application No. 10-2011-0133192, filed on Dec. 12, 2011, entitled "Nitride Based Semiconductor Device and Manufacturing Method Thereof", which is hereby incorporated by reference in its entirety into this application.

BACKGROUND OF THE INVENTION

1. Technical Field

The present invention relates to a nitride based semiconductor device and a manufacturing method thereof.

2. Description of the Related Art

In response to reducing power consumption due to a green energy policy, an increase in power conversion efficiency has become the main focus. In power conversion, total power conversion efficiency depends on efficiency of a power switching element. Most of power elements used in the related art include a power MOSFET or IGBT using silicon, but there is a limit to increasing efficiency of an element due to a limit in a physical property of silicon.

In order to solve the limitation, as described in Korean Patent Laid-Open Publication No. 2007-0092482 (Laid-Open Published on Sep. 13, 2007), research to increase conversion efficiency by manufacturing a nitride based field effect transistor based on nitride such as GaN is in progress.

The nitride based field effect transistor has a so called high electron mobility transistor (hereinafter, referred to as a 'HEMT') structure. For example, the semiconductor device having the HEMT structure includes a base substrate, a nitride based semiconductor layer formed on the base substrate, a source pad and a drain pad placed on the semiconductor layer, and a gate pad placed on the semiconductor layer between the source electrode and the drain electrode. A 2-Dimensional electron gas (2DEG) used as a movement path of current in the semiconductor layer may be generated in the semiconductor device.

However, in the nitride based field effect transistor having such a structure, a pad area which is not used directly in an active region is widely formed. As a result, by parasitic capacitance generated in the pad area, a switching speed decreases or undesired leakage current is generated.

SUMMARY OF THE INVENTION

The present invention has been made in an effort to provide a nitride based semiconductor device capable of preventing parasitic capacitance and leakage current from being generated.

Further, the present invention has been made in an effort to provide a manufacturing method of the nitride based semiconductor device.

According to a preferred embodiment of the present invention, there is provided a nitride based semiconductor device, including: a substrate; a nitride based semiconductor layer having a lower nitride based semiconductor layer and an upper nitride based semiconductor layer formed on the substrate; an isolation area including an interface between the lower nitride based semiconductor layer and the upper nitride based semiconductor layer; and drain electrodes, source electrode, and gate electrodes formed on the upper nitride based semiconductor layer.

The nitride based semiconductor device may further include a buffer layer formed between the substrate and the lower nitride based semiconductor layer.

The isolation area may be provided in lower parts of the drain electrodes, lower parts of the source electrodes, and lower parts of gate pads of the gate electrodes.

The isolation area may be formed by an area into which an inert element is implanted.

The isolation area may include an interface between the lower nitride based semiconductor layer and the upper nitride based semiconductor layer with respect to the lower parts of the drain electrodes, the source electrodes, and the gate pads of the gate electrodes and the isolation area is provided to contact the lower parts of the drain electrodes, the source electrodes, and the gate pads of the gate electrodes.

According to an another preferred embodiment of the present invention, there is provided a manufacturing method of a nitride based semiconductor device, including: providing a substrate; sequentially stacking a lower nitride based semiconductor layer and an upper nitride based semiconductor layer on the substrate; forming an isolation area including an interface between the lower nitride based semiconductor layer and the upper nitride based semiconductor layer; and forming drain electrodes, source electrodes, and gate electrodes on the upper nitride based semiconductor layer.

The forming of the isolation area may include: forming a photoresist pattern exposing an area corresponding to the isolation area on the top of the upper nitride based semiconductor layer; and ion-implanting an inert element into the area corresponding to the isolation area by using the photoresist pattern.

The forming of the isolation area may include: forming the photoresist pattern exposing the area corresponding to the isolation area on the top of the upper nitride based semiconductor layer; ion-implanting the inert element into the area corresponding to the isolation area by using the photoresist pattern; and forming the isolation area including the interface in the lower parts of the drain electrodes, the source electrodes, and the gate pads of the gate electrodes up to the top of the upper nitride based semiconductor layer by a heat diffusion process of the implanted inert element.

DESCRIPTION OF THE PREFERRED EMBODIMENTS

Figure 1:
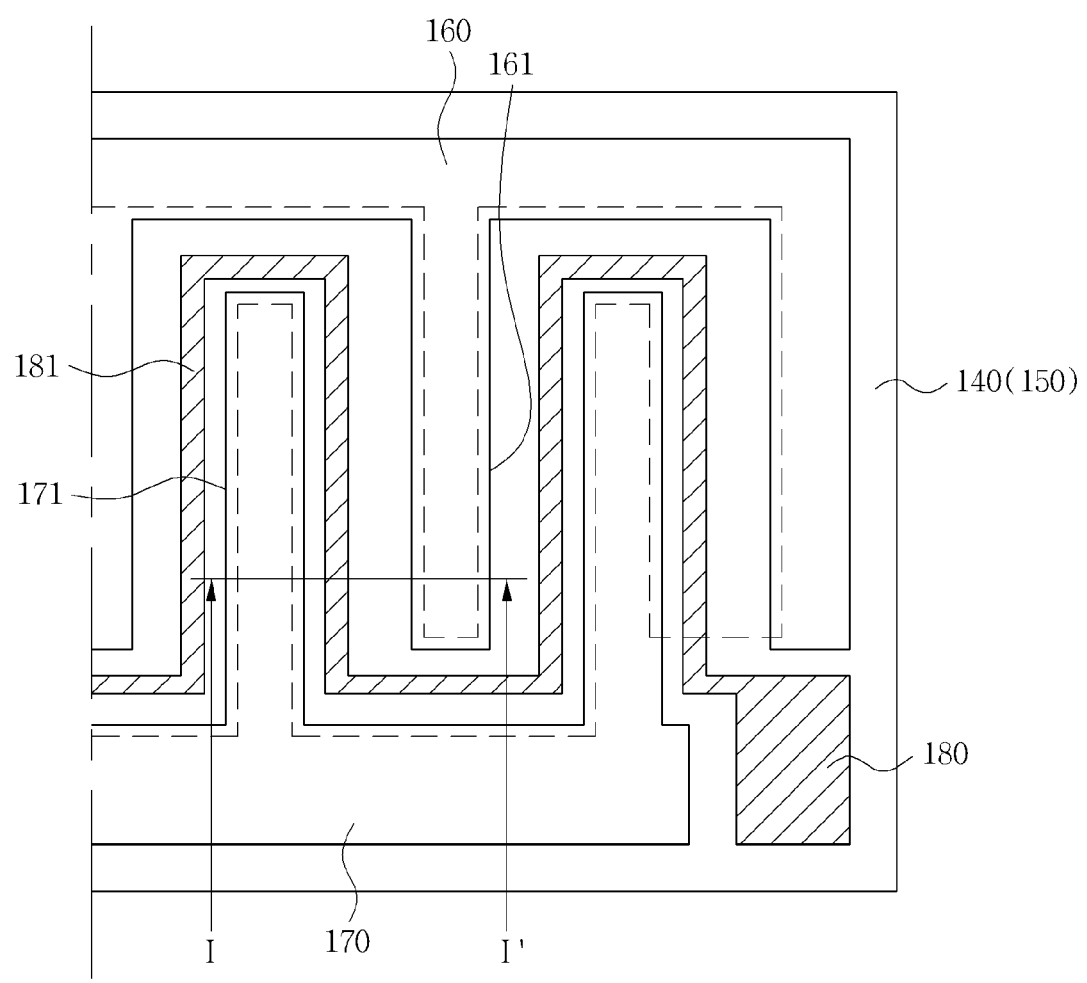
FIG. 1 is a plan view of a nitride based semiconductor device according to a preferred embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In the description, the terms "first," "second," and so on are used to distinguish one element from another element, and the elements are not defined by the above terms. Further, in describing the present invention, a detailed description of related known functions or configurations will be omitted so as not to obscure the subject of the present invention.

Figure 2:
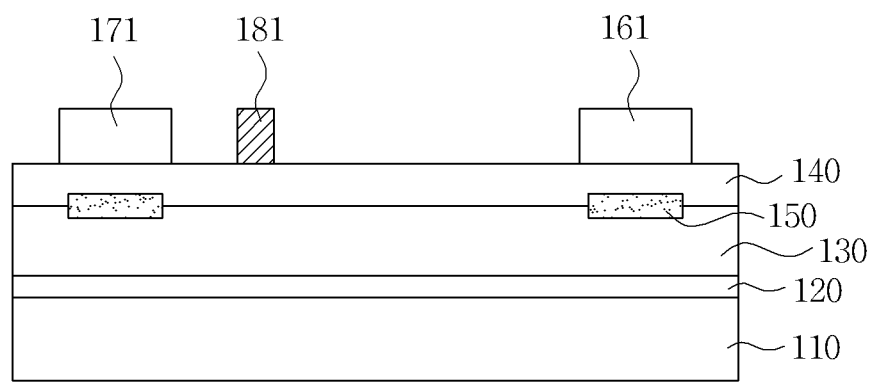
FIG. 2 is a cross-sectional view showing a cross section taken along line I-I' of FIG. 1.

Hereinafter, preferred embodiments of the present invention will be described in detail with reference to the accompanying drawings. FIG. 1 is a plan view of a nitride based semiconductor device according to a preferred embodiment of the present invention. FIG. 2 is a cross-sectional view showing a cross section taken along line I-I' of FIG. 1.

The nitride based semiconductor device according to the preferred embodiment of the present invention includes a substrate 110, a buffer layer 120, a nitride based semiconductor layer constituted by a lower nitride based semiconductor layer 130 and an upper nitride based semiconductor layer 140, an isolation area 150 including an interface between the lower nitride based semiconductor layer 130 and the upper nitride based semiconductor layer 140, and drain electrodes 160 and 161, source electrodes 170 and 171, and gate electrodes 180 and 181 formed on the upper nitride based semiconductor layer 140.

The substrate 110 is an insulating substrate, but the substrate 110 as a substrate which may have high resistance or be doped by an n or p type and for example, may be at least one of a silicon substrate, a silicon carbide substrate, and a sapphire substrate.

The buffer layer 120 may be selectively formed on the top of the substrate 110. The buffer layer 120 may be made of AlN or GaN, but is not limited thereto. Herein, the buffer layer 120 may be provided to solve problems caused due to a lattice mismatch between the substrate 110 and the lower nitride based semiconductor layer 130 to be formed thereafter.

The nitride based semiconductor layer formed by stacking the lower nitride based semiconductor layer 130 and the upper nitride based semiconductor layer 140 may be formed toward the top of the substrate 110 or the buffer layer 120.

The nitride based semiconductor layer is a structure layer where a two-dimensional electron gas (2-DEG channel) channel is formed on the interface between the lower nitride based semiconductor layer 130 and the upper nitride based semiconductor layer 140. As a result, the upper nitride based semiconductor layer 140 may be made of a material having a larger energy band gap than the lower nitride based semiconductor layer 130.

The lower nitride based semiconductor layer 130 and the upper nitride based semiconductor layer 140 may be made of a III-nitride based material. Specifically, each of the lower nitride based semiconductor layer 130 and the upper nitride based semiconductor layer 140 may be made of any one of GaN, AlGaN, InGaN, and InAlGaN. Herein, the lower nitride based semiconductor layer 130 is made of GaN and the upper nitride based semiconductor layer 140 is made of AlGaN.

As a result, the GaN buffer layer 120 is grown on the substrate 110 by using a vapor growth method and subsequently, a GaN epitaxial layer is grown on the GaN buffer layer 120 with the lower nitride based semiconductor layer 130. In this case, a growth method up to the upper nitride based semiconductor layer 140 from the GaN buffer layer 120 may be performed in-situ in a vapor growth apparatus.

The isolation area 150 includes the interface between the lower nitride based semiconductor layer 130 and the upper nitride based semiconductor layer 140 by implanting an inert element such as Ar, N, or the like, while the isolation area 150 is formed in lower parts of the drain electrode 160 and 161, the source electrodes 170 and 171, and the gate pad 180.

The isolation area 150 may be overlapped with the lower parts of the drain electrodes 160 and 161, the source electrodes 170 and 171, and the gate pad 180 except for the gate line 181.

Specifically, the isolation area 150 includes the lower parts of the drain pad 160, the source pad 170, and the gate pad 180 to be formed at an edge of the device like FIG. 1. The isolation area 150 may be overlapped 171 with respect to a drain finger 161 and a source finger 171 in the inside toward the center of each of the drain finger 161 and the source finger 171 below the drain finger 161 and the source finger 171.

The isolation area 150 includes a channel region positioned in the lower parts of the drain electrodes 160 and 161, the source electrodes 170 and 171, and the gate pad 180, and as a result, a switching speed can be prevented from being deteriorated due to parasitic capacitance generated from a relationship with a channel in the related art.

In particular, as shown in FIG. 1, the isolation area 150 is formed in the lower part of the gate pad 180 to remove parasitic capacitance between the gate pad 180 and the channel. As a result, when the parasitic capacitance is removed between the gate pad 180 and the channel, the switching speed through the gate pad 180 can be improved.

Further, since the isolation area 150 is an insulating area made of the inert element, leakage current generated in the channel region positioned in the lower parts of the drain electrodes 160 and 161, the source electrodes 170 and 171, and the gate pad 180 can be interrupted.

As a result, the 2DEG formed around the interface between the lower nitride based semiconductor layer 130 and the upper nitride based semiconductor layer 140 is formed below an area other than the lower parts of the drain electrodes 160 and 161, the source electrodes 170 and 171, and the gate pad 180, in particular, below the gate line 181.

Accordingly, since the nitride based semiconductor device having the 2DEG channel solves problems such as the parasitic capacitance and the leakage current, the nitride based semiconductor device can improve the switching speed through the gate pad.

Hereinafter, a manufacturing method of a nitride based semiconductor device according to a preferred embodiment of the present invention will be described with reference to FIGS. 3 to 6. FIGS. 3 to 6 are process cross-sectional views for illustrating a manufacturing method of a nitride based semiconductor device according to a preferred embodiment of the present invention.

Figure 3:
FIGS. 3 to 6 are process cross-sectional views for illustrating a manufacturing method of a nitride based semiconductor device according to a preferred embodiment of the present invention.

As shown in FIG. 3, in the manufacturing method of the nitride based semiconductor device according to the preferred embodiment of the present invention, a substrate 110 is first provided.

The substrate 110 is an insulating substrate, but the substrate 110 as a substrate which may have high resistance or be doped by an n or p type and for example, may be at least one of a silicon substrate, a silicon carbide substrate, and a sapphire substrate.

Figure 4:
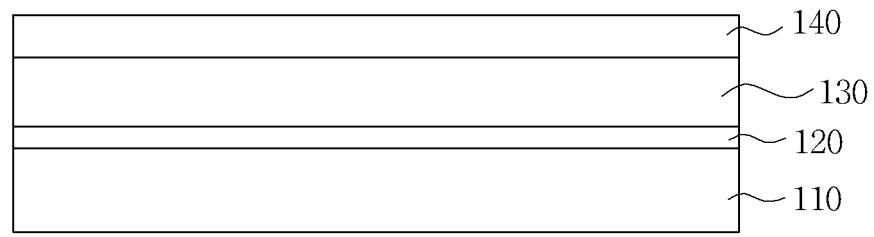

Subsequently, as shown in FIG. 4, the buffer layer 120, the lower nitride based semiconductor layer 130, and the upper nitride based semiconductor layer 140 are sequentially stacked toward the top of the substrate 110.

Specifically, a method of forming the buffer layer 120, the lower nitride based semiconductor layer 130, and the upper nitride based semiconductor layer 140 may be performed in-situ in the same vapor epitaxial growth facility (not shown) by using a vapor deposition method, for example, a vapor epitaxial growth method such as for example, atomic layer epitaxy (ALE), atmospheric pressure chemical vapor deposition (APCVD), plasma enhanced chemical vapor deposition (PECVD), rapid thermal chemical vapor deposition (RTCVD), ultrahigh vacuum chemical vapor deposition (UHVCVD), low pressure chemical vapor deposition (LPCVD), metal organic chemical vapor deposition (MOCVD), or the like.

The buffer layer 120 may be selectively formed on the top of the substrate 110 by using AlN or GaN in order to solve problems caused due to a lattice mismatch between the substrate 110 and the lower nitride based semiconductor layer 130.

Each of the lower nitride based semiconductor layer 130 and the upper nitride based semiconductor layer 140 may be made of any one of GaN, AlGaN, InGaN, and InAlGaN. Herein, since the upper nitride based semiconductor layer 140 is made of a material having a larger energy band gap than the lower nitride based semiconductor layer 130, when the lower nitride based semiconductor layer 130 is made of GaN, the upper nitride based semiconductor layer 140 is made of AlGaN.

Figure 5:
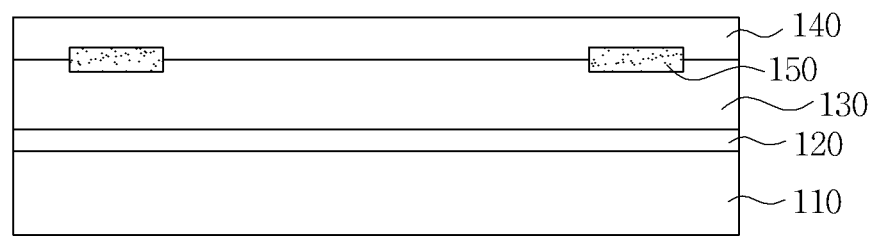

After the buffer layer 120, the lower nitride based semiconductor layer 130, and the upper nitride based semiconductor layer 140 are sequentially stacked toward the top of the substrate 110, an inert element such as Ar, N, or the like is implanted into the isolation area 150 including the interface area between the lower nitride based semiconductor layer 130 and the upper nitride based semiconductor layer 140 as shown in FIG. 5.

Specifically, in order to form the isolation area 150, an area corresponding to the isolation area 150 is exposed to the top of the upper nitride based semiconductor layer 140 and a photoresist pattern (not shown) covering an area other than the exposed area is formed.

When the inert element such as Ar, N, or the like is implanted by using the photoresist pattern, the isolation area 150 is formed. In this case, the isolation area 150 may include the interface between the lower nitride based semiconductor layer 130 and the upper nitride based semiconductor layer 140 by adjusting the quantity of implanted ions and an output.

Of course, the isolation area 150 may be formed by using various methods such as delta doping, plasma doping, and the like other than the method.

Figure 6:
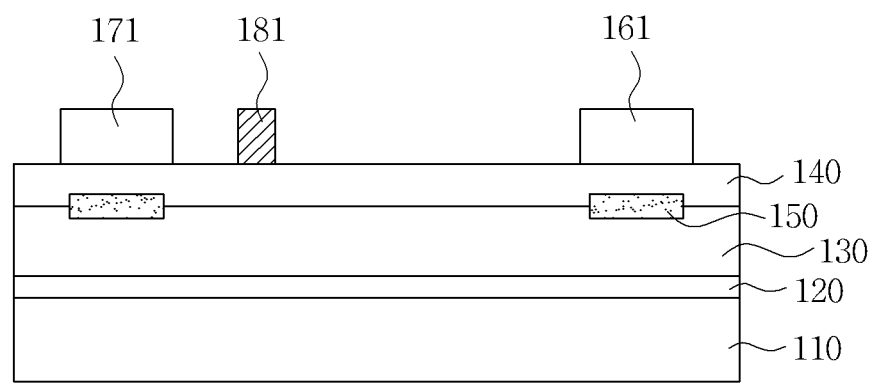

After the isolation area 150 is formed, the drain electrodes 160 and 161, the source electrode 170 and 171, and the gate electrodes 180 and 181 are formed on the top of the upper nitride based semiconductor layer 140 as shown in FIG. 6. Herein, the drain electrodes 160 and 161 and the source electrodes 170 and 171 are first formed, and subsequently, the gate electrodes 180 and 181 may be formed. Further, the gate electrodes 180 and 181 may selectively have a gate insulating layer (not shown) therebelow.

Specifically, a forming process of the drain electrodes 160 and 161 and the source electrodes 170 and 171 may include (i) forming the photoresist pattern exposing areas of the drain electrodes 160 and 161 and the source electrodes 170 and 171, (ii) depositing a metallic material by using the photoresist pattern, (iii) a lift-off operation of removing the photoresist pattern, and (iv) performing rapid thermal annealing (RTA) with respect to metallic patterns of the drain electrodes 160 and 161 and the source electrodes 170 and 171 that remain.

Herein, the performing of the RTA may be performed so that the drain electrodes 160 and 161 and the source electrodes 170 and 171 are in ohmic contact with each other. The bonding strength between the drain electrodes 160 and 161 and the source electrodes 170 and 171 that are in ohmic contact with each other can be improved.

Thereafter, the gate electrodes 180 and 181 are formed on the top of the upper nitride based semiconductor layer 140.

In the manufacturing method of the nitride based semiconductor device according to the preferred embodiment of the present invention, the isolation area 150 including the interface between the lower nitride based semiconductor layer 130 and the upper nitride based semiconductor layer 140 is easily formed by adjusting the quantity of implanted ions and the output.

Accordingly, the manufacturing method of the nitride based semiconductor device according to the preferred embodiment of the present invention can provide the nitride based semiconductor device that can solve the problems of the parasitic capacitance and the leakage current generated in the lower parts of the drain electrodes 160 and 161, the source electrodes 170 and 171, and the gate pad 180.

Figure 7:
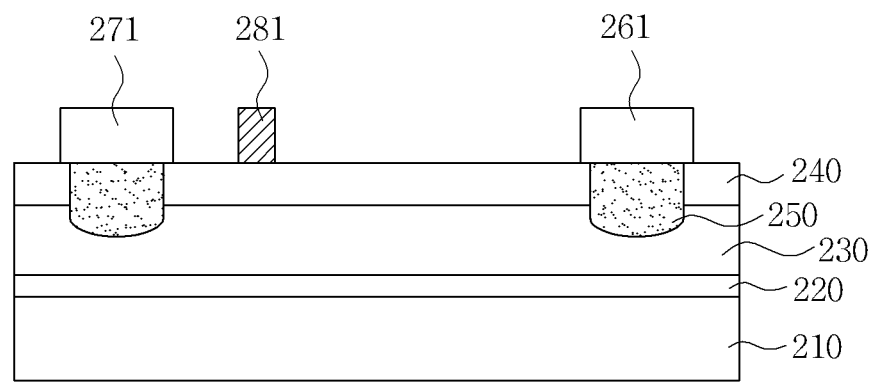
FIG. 7 is a cross-sectional view of a nitride based semiconductor device according to another preferred embodiment of the present invention.

Hereinafter, a nitride based semiconductor device according to another preferred embodiment of the present invention will be described with reference to FIG. 7. FIG. 7 is a cross-sectional view of a nitride based semiconductor device according to another preferred embodiment of the present invention.

The nitride based semiconductor device according to another preferred embodiment of the present invention is similar to the nitride based semiconductor device according to the preferred embodiment of the present invention shown in FIG. 1.

However, in the nitride based semiconductor device according to another preferred embodiment of the present invention, as an isolation area 250 an area including an interface between a lower nitride based semiconductor layer 230 and an upper nitride based semiconductor layer 240 is widely formed up to the top of the upper nitride based semiconductor layer 240.

The isolation area 250 in the nitride based semiconductor device according to another preferred embodiment of the present invention may be formed similarly as the forming method of the isolation area 150 shown in FIG. 2, while after ions are implanted by adjusting the quantity of implanted ions and an output, drain electrodes, source electrodes, and gate pads may be overlapped with each other at lower centers thereof by a heat diffusion process to be formed up to the top of the upper nitride based semiconductor layer 240.

In this case, since the isolation area 250 is formed to contact electrodes including the drain electrodes, the source electrodes, and the gate pads, the isolation area 250 can further interrupt generation of leakage current and parasitic capacitance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A nitride based semiconductor device, comprising:
a substrate;
a nitride based semiconductor layer having a lower nitride based semiconductor layer and an upper nitride based semiconductor layer formed on the substrate;
a drain electrodes, a source electrode, and a gate electrodes formed on the upper nitride based semiconductor layer,
an isolation area that acts as an interface between the lower nitride based semiconductor layer and the upper nitride based semiconductor layer having both its vertical edges directly beneath each of the drain electrode and the source electrode when viewing a cross section of the device.

2. The nitride based semiconductor device as set forth in claim 1, further comprising a buffer layer formed between the substrate and the lower nitride based semiconductor layer.

3. The nitride based semiconductor device as set forth in claim 1, wherein the isolation area is formed by an area into which an inert element is implanted.

4. The nitride based semiconductor device as set forth in claim 1, wherein the isolation area reaches vertically to the top of the upper nitride based semiconductor layer.

5. The nitride based semiconductor device as set forth in claim 4, wherein a drain finger of the drain electrode and a source finger of the source electrode are interleaved by a gate finger of the gate electrode.

* * * * *